(12) United States Patent
Ben Baruch et al.

(10) Patent No.: US 11,631,179 B2
(45) Date of Patent: Apr. 18, 2023

(54) SEGMENTATION OF AN IMAGE OF A SEMICONDUCTOR SPECIMEN

(71) Applicant: Applied Materials Israel Ltd., Rehovot (IL)

(72) Inventors: Elad Ben Baruch, Kiryat Gat (IL); Shalom Elkayam, Ramla (IL); Shaul Cohen, Irus (IL); Tal Ben-Shlomo, Givatayim (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 275 days.

(21) Appl. No.: 16/917,692

(22) Filed: Jun. 30, 2020

(65) Prior Publication Data
US 2021/0407093 A1    Dec. 30, 2021

(51) Int. Cl.
*G06N 20/00*    (2019.01)
*G06T 7/11*    (2017.01)
(Continued)

(52) U.S. Cl.
CPC .............. *G06T 7/11* (2017.01); *G06F 17/18* (2013.01); *G06F 30/27* (2020.01); *G06N 20/00* (2019.01);
(Continued)

(58) Field of Classification Search
CPC ................. G06T 7/11; G06T 7/187; G06T 2207/20081; G06N 20/00; G06F 3/27; G06F 17/18
See application file for complete search history.

(56) References Cited

U.S. PATENT DOCUMENTS

| 2009/0116737 A1* | 5/2009 | Kiraly | G06T 7/143 382/160 |
| 2013/0166481 A1* | 6/2013 | Nowozin | G06K 9/6256 706/12 |

(Continued)

OTHER PUBLICATIONS

Yumiba, Ryo, et al. "Deep learnings impact on contour extraction for design based metrology and design based inspection." Proceedings of SPIE, Metrology, Inspection, and Process Control for Microlithography XXXIII. Mar. 26, 2019, 10 pages, vol. 10959.
(Continued)

*Primary Examiner* — Syed Haider
(74) *Attorney, Agent, or Firm* — Lowenstein Sandler LLP

(57) ABSTRACT

There is provided a system and method of segmenting an image of a fabricated semiconductor specimen. The method includes: obtaining a first probability map corresponding to the image representative of at least a portion of the fabricated semiconductor specimen and indicative of predicted probabilities of pixels in the image to correspond to one or more first structural elements presented in the image, obtaining a first label map informative of one or more segments representative of second structural elements and labels associated with the segments, performing simulation on the first label map to obtain a second probability map indicative of simulated probabilities of pixels in the first label map to correspond to the one or more segments, and generating a second label map based on the first probability map and the second probability map, the second label map being usable for segmentation of the image with enhanced repeatability.

20 Claims, 5 Drawing Sheets

(51) Int. Cl.
*G06T 7/187* (2017.01)
*G06F 17/18* (2006.01)
*G06F 30/27* (2020.01)

(52) U.S. Cl.
CPC .... *G06T 7/187* (2017.01); *G06T 2207/20081* (2013.01)

(56) References Cited

U.S. PATENT DOCUMENTS

| | | | | |
|---|---|---|---|---|
| 2017/0177997 | A1* | 6/2017 | Karlinsky | G06V 10/82 |
| 2017/0364798 | A1* | 12/2017 | Karlinsky | G06N 3/0454 |
| 2018/0060702 | A1* | 3/2018 | Ma | G06K 9/6228 |
| 2020/0278408 | A1* | 9/2020 | Sung | G06V 10/82 |
| 2021/0390701 | A1* | 12/2021 | Fan | G06T 7/0012 |

OTHER PUBLICATIONS

"Bilateral Filter," Wikipedia—The Wayback Machine; 2 pages; downloaded from https://web.archive.org/web/20190717023608/https://en.wikipedia.org/wiki/Bilateral_filter from Nov. 17, 2019.
"Gaussian blur", Wikipedia—The Wayback Machine; 4 pages; downloaded from https://web.archive.org/web/20191117195922/https://en.wikipedia.org/wiki/Gaussian_blur from Nov. 17, 2019.

* cited by examiner

SEGMENTATION OF AN IMAGE OF A SEMICONDUCTOR SPECIMEN

TECHNICAL FIELD

The presently disclosed subject matter relates, in general, to the field of examination of a specimen, and more specifically, to segmentation of an image of a specimen.

BACKGROUND

Current demands for high density and performance associated with ultra large scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations, as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

By way of non-limiting example, run-time examination can employ a two phase procedure, e.g. inspection of a specimen followed by review of sampled locations of potential defects. During the first phase, the surface of a specimen is inspected at high-speed and relatively low-resolution. In the first phase, a defect map is produced to show suspected locations on the specimen having high probability of a defect. During the second phase, at least some of the suspected locations are more thoroughly analyzed with relatively high resolution. In some cases both phases can be implemented by the same inspection tool, and, in some other cases, these two phases are implemented by different inspection tools.

Examination processes are used at various steps during semiconductor fabrication to detect and classify defects on specimens, as well as perform metrology related operations. Effectiveness of examination can be increased by automatization of process(es) as, for example, Automatic Defect Classification (ADC), Automatic Defect Review (ADR), image segmentation, etc.

SUMMARY

In accordance with certain aspects of the presently disclosed subject matter, there is provided a method of segmenting an image of a fabricated semiconductor specimen, the method performed by a processor and memory circuitry (PMC), the method comprising: obtaining a first probability map corresponding to the image representative of at least a portion of the fabricated semiconductor specimen and indicative of predicted probabilities of pixels in the image to correspond to one or more first structural elements presented in the image, wherein the first probability map is generated by processing the image using a deep learning model; obtaining a first label map informative of one or more segments representative of second structural elements and labels associated with the segments, wherein the second structural elements are presented in design data charactering the at least portion, and wherein equivalent second structural elements are associated with the same label; performing simulation on the first label map to obtain a second probability map indicative of simulated probabilities of pixels in the first label map to correspond to the one or more segments; and generating a second label map based on the first probability map and the second probability map, wherein the second label map is informative of one or more segments representative of the first structural elements and labels associated therewith, and wherein equivalent first structural elements are associated with the same label, the second label map being usable for segmentation of the image with enhanced repeatability.

In addition to the above features, the method according to this aspect of the presently disclosed subject matter can comprise one or more of features (i) to (xii) listed below, in any desired combination or permutation which is technically possible:

(i). The performing simulation can comprise: performing a distance transform on the first label map to obtain a distance map based on a relative distance between each given pixel in the first label map and a closest edge therefrom; and transforming the distance map into the second probability map informative of simulated probabilities of the pixels in the first label map to correspond to the one or more segments as relative to the closest edge.

(ii). The relative distance can include, for each given pixel in the first label map: i) a distance between the given pixel and a closest edge therefrom, and ii) a relative position of the given pixel with respect to the closest edge.

(iii). The relative position can indicate whether the given pixel is located within a given second structural element whose contour comprises the closest edge, or outside of the given second structural element.

(iv). The first label map can be generated based on at least one of the following: the design data, the image, and the first probability map.

(v). The generating can comprise: combining the first probability map and the second probability map to obtain a combined probability map; and using a resolver to process the combined probability map, giving rise to the second label map.

(vi). The combining can be performed using a predetermined weight factor indicative of a desired tradeoff level between sensitivity and repeatability of the segmentation of the image.

(vii). The resolver can be selected from a group comprising: DCRF, Graph-cut and Hidden Markov Model (HMM).
(viii). The resolver can be a DCRF resolver, and the combined probability map can be processed based on a unary term and a pairwise term.
(ix). The pairwise term can be constructed based on an appearance kernel and a smoothness kernel.
(x). The appearance kernel can be an edge preserving denoiser that determines a label of a given pixel based on similar neighboring pixels thereof, and the smoothness kernel determines a label of a given pixel based on neighboring pixels thereof
(xi). The image can be a high-resolution review image of the specimen obtained from a review tool.
(xii). The second label map can have enhanced repeatability as compared to a label map generated from the first probability map.

In accordance with other aspects of the presently disclosed subject matter, there is provided a system of segmenting an image of a fabricated semiconductor specimen, the system comprising a processor and memory circuitry (PMC) configured to: obtain a first probability map corresponding to the image representative of at least a portion of the fabricated semiconductor specimen and indicative of predicted probabilities of pixels in the image to correspond to one or more first structural elements presented in the image, wherein the first probability map is generated by processing the image using a deep learning model; obtain a first label map informative of one or more segments representative of second structural elements and labels associated with the segments, wherein the second structural elements are presented in design data characterizing the at least portion, and wherein equivalent second structural elements are associated with the same label; perform simulation on the first label map to obtain a second probability map indicative of simulated probabilities of pixels in the first label map to correspond to the one or more segments; and generate a second label map based on the first probability map and the second probability map, wherein the second label map is informative of one or more segments representative of the first structural elements and labels associated therewith, and wherein equivalent first structural elements are associated with the same label, the second label map being usable for segmentation of the image with enhanced repeatability.

This aspect of the disclosed subject matter can comprise one or more of features (i) to (xii) listed above with respect to the method, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of segmenting an image of a fabricated semiconductor specimen, the method comprising: obtaining a first probability map corresponding to the image representative of at least a portion of the fabricated semiconductor specimen and indicative of predicted probabilities of pixels in the image to correspond to one or more first structural elements presented in the image, wherein the first probability map is generated by processing the image using a deep learning model; obtaining a first label map informative of one or more segments representative of second structural elements and labels associated with the segments, wherein the second structural elements are presented in design data characterizing the at least portion, and wherein equivalent second structural elements are associated with the same label; performing simulation on the first label map to obtain a second probability map indicative of simulated probabilities of pixels in the first label map to correspond to the one or more segments; and generating a second label map based on the first probability map and the second probability map, wherein the second label map is informative of one or more segments representative of the first structural elements and labels associated therewith, and wherein equivalent first structural elements are associated with the same label, the second label map being usable for segmentation of the image with enhanced repeatability.

This aspect of the disclosed subject matter can comprise one or more of features (i) to (xii) listed above with respect to the method, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "generating", "performing", "obtaining", "simulating", "transforming", "combining", "using", "processing", "determining" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the segmentation system and respective parts thereof disclosed in the present application.

The terms "non-transitory memory" and "non-transitory storage medium" used herein should be expansively construed to cover any volatile or non-volatile computer memory suitable to the presently disclosed subject matter.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Figure 1:
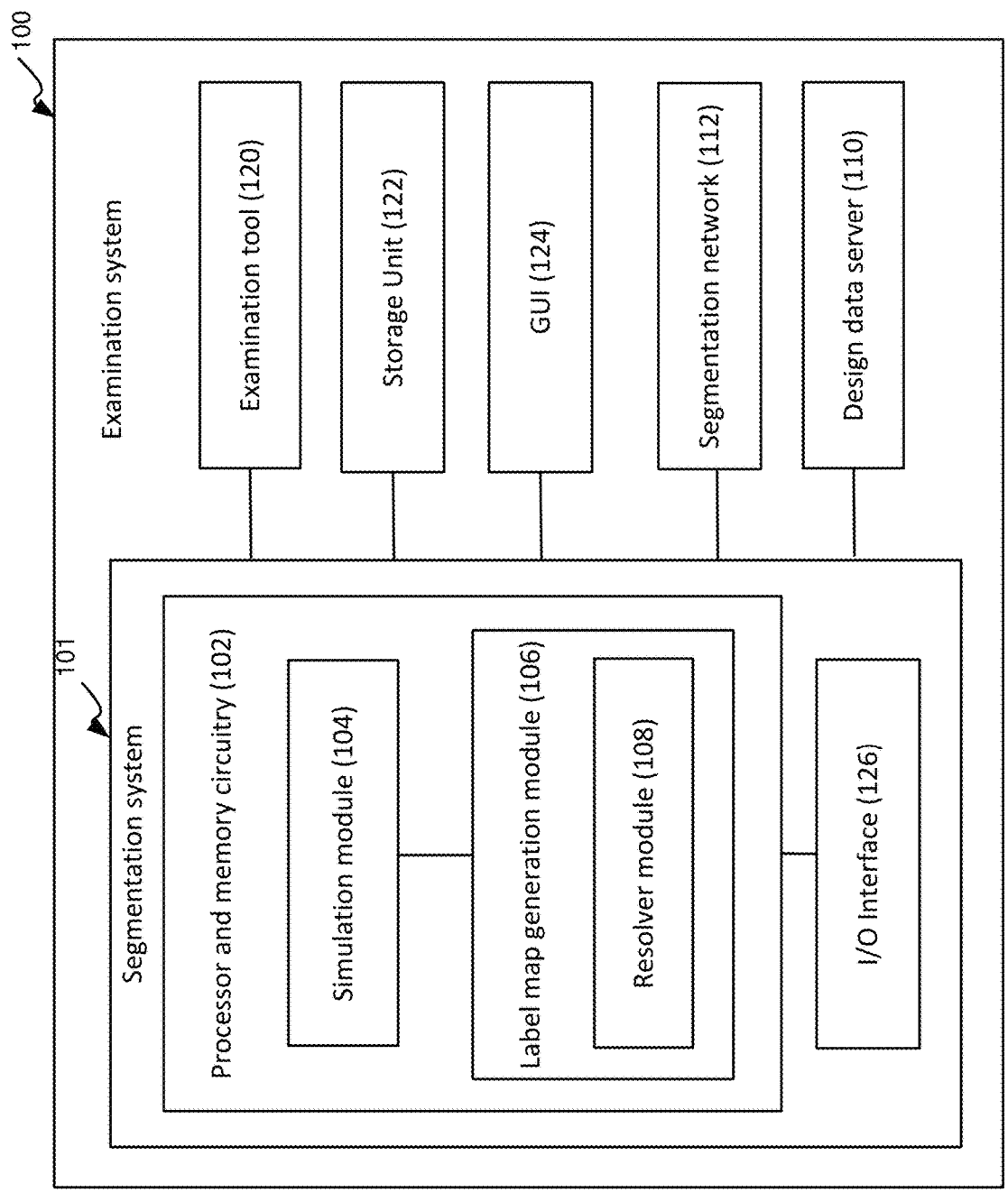
FIG. 1 illustrates a functional block diagram of an examination system in accordance with certain embodiments of the presently disclosed subject matter.

Bearing this in mind, attention is drawn to FIG. 1 illustrating a functional block diagram of an examination system in accordance with certain embodiments of the presently disclosed subject matter.

The examination system 100 illustrated in FIG. 1 can be used for examination of a semiconductor specimen (e.g. of a wafer and/or parts thereof) as part of the specimen fabrication process. The illustrated examination system 100 comprises a computer-based system 101 capable of automatically determining metrology-related and/or defect-related information using images obtained during specimen fabrication (referred to hereinafter as fabrication process (FP) images or images). The system 101 can be generally referred to as an FPEI (Fabrication Process Examination Information) system. According to certain embodiments of the presently disclosed subject matter, the system 101 can be configured to perform segmentation of an FP image representative of at least a portion of a specimen, as will be described below in further detail with reference to FIG. 2. System 101 is thus also referred to as segmentation system in the present disclosure. System 101 can be operatively connected to one or more examination tools 120. The examination tools 120 are configured to capture FP images and/or to review the captured FP image(s) and/or to enable or provide measurements related to the captured image(s). The system 101 can be further operatively connected to a design data server 110 and a storage unit 122.

For example, FP images (also referred to herein as images) can be selected from images of a specimen (e.g. wafer or parts thereof) captured during the manufacturing process, derivatives of the captured images obtained by various pre-processing stages (e.g. images of a part of a wafer or a photomask captured by SEM or an optical inspection system, SEM images roughly centered around the defect to be classified by ADC, SEM images of larger regions in which the defect is to be localized by ADR, registered images of different examination modalities corresponding to the same mask location, segmented images, height map images, etc.). It is to be noted that in some cases the images can include image data (e.g. captured images, processed images, etc.) and associated numeric data (e.g. metadata, hand-crafted attributes, etc.). It is further noted that image data can include data related to a layer of interest and/or to one or more other layers of the specimen.

The term "examination tool(s)" used herein should be expansively construed to cover any tools that can be used in examination-related processes including, by way of non-limiting example, imaging, scanning (in a single or in multiple scans), sampling, reviewing, measuring, classifying and/or other processes provided with regard to the specimen or parts thereof. The one or more examination tools 120 can include one or more inspection tools and/or one or more review tools. In some cases, at least one of the examination tools 120 can be an inspection tool configured to scan a specimen (e.g., an entire wafer, an entire die, or portions thereof) to capture inspection images (typically, at relatively high-speed and/or low-resolution) for detection of potential defects. In some cases, at least one of the examination tools 120 can be a review tool, which is configured to capture review images of at least some of the defects detected by inspection tools for ascertaining whether a potential defect is indeed a defect. Such a review tool is usually configured to inspect fragments of a die, one at a time (typically, at relatively low-speed and/or high-resolution). Inspection tool and review tool can be different tools located at the same or at different locations, or a single tool operated in two different modes. In some cases at least one examination tool can have metrology capabilities.

Without limiting the scope of the disclosure in any way, it should also be noted that the examination tools 120 can be implemented as inspection machines of various types, such as optical imaging machines, electron beam inspection machines, and so on. In some cases the same examination tool can provide low-resolution image data and high-resolution image data.

System 101 includes a processor and memory circuitry (PMC) 102 operatively connected to a hardware-based I/O interface 126. PMC 102 is configured to provide all processing necessary for operating the system 101 as further detailed with reference to FIG. 2 and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

Functional modules comprised in PMC 102 include a simulation module 104 and a label map generation module 106. In certain embodiments, the label map generation module 106 can comprise a resolver module 108. The PMC 102 can be configured to obtain, via I/O interface 126, a first probability map corresponding to an image representative of at least a portion of the fabricated semiconductor specimen and indicative of predicted probabilities of pixels in the image to correspond to one or more first structural elements presented in the image. The first probability map can be generated by processing the image using a deep learning model (e.g., the segmentation network 112). The PMC 102 can be further configured to obtain a first label map informative of one or more segments representative of second structural elements and labels associated with the segments. The second structural elements are presented in design data charactering the at least portion. Equivalent second structural elements are associated with the same label. The simulation module 104 can be configured to perform simulation on the first label map to obtain a second probability map indicative of simulated probabilities of pixels in the first label map to correspond to the one or more segments. The label map generation module 106 can be configured to generate a second label map based on the first probability map and the second probability map. The second label map is informative of one or more segments representative of the first structural elements and labels associated therewith. Equivalent first structural elements are associated with the same label. The second label map can be usable for segmentation of the image with enhanced repeatability. Operation of system 101, PMC 102 and the functional modules therein will be further detailed with reference to FIG. 2.

According to certain embodiments, the system 101 can be operatively connected with a deep learning model, such as, e.g., the segmentation network 112 as illustrated. The segmentation network 112 can be a deep neural network (DNN) which includes layers organized in accordance with respective DNN architecture. By way of non-limiting example, the layers of DNN can be organized in accordance with Convolutional Neural Network (CNN) architecture, Recurrent Neural Network architecture, Recursive Neural Networks architecture, Generative Adversarial Network (GAN) architecture, or otherwise. Optionally, at least some of the layers can be organized in a plurality of DNN sub-networks. Each layer of DNN can include multiple basic computational elements (CE) typically referred to in the art as dimensions, neurons, or nodes.

Generally, computational elements of a given layer can be connected with CEs of a preceding layer and/or a subsequent layer. Each connection between a CE of a preceding layer and a CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g. the weighted sum of the inputs) and further derive an output by applying an activation function to the computed activation. It is noted that the teachings of the presently disclosed subject matter are not bound by specific architecture of the DNN.

In some embodiments, system 101 can further comprise the segmentation network 112 or part thereof. In other words, the respective functions of the segmentation network 112 can, at least partly, be integrated within system 101.

Additionally to the segmentation system 101, the examination system 100 can comprise one or more examination modules, such as, e.g., defect detection module and/or Automatic Defect Review Module (ADR) and/or Automatic Defect Classification Module (ADC) and/or metrology-related module and/or other examination modules. Such examination modules can utilize the output of the segmentation system 101 for examination of a semiconductor specimen. In some cases, the one or more examination modules can be at least partially integrated with the one or more examination tools 120.

According to certain embodiments, the system 101 can be operatively connected with a design data server 110 (e.g., CAD server) via the hardware-based I/O interface 126. The design data server 110 is configured to store and provide design data characterizing the specimen. The design data of the specimen can be in any of the following formats: the physical design layout (e.g., CAD clip) of the specimen, a raster image, and a simulated image derived from the design layout. According to certain embodiments, a first label map informative of one or more segments representative of second structural elements (i.e., structural elements presented in the design data) and labels associated therewith can be derived, e.g., from the design data, and stored in the design data server 110 or the storage unit 122, and the I/O interface 126 can be configured to receive the first label map therefrom. Alternatively, the I/O interface 126 can receive, from the design data server 110, design data characterizing at least a given portion of the specimen, and provide to the PMC 102 to process the design data to derive the first label map.

According to certain embodiments, system 101 can comprise a storage unit 122. The storage unit 122 can be configured to store any data necessary for operating system 101, e.g., data related to input and output of system 101, as well as intermediate processing results generated by system 101. By way of example, the storage unit 122 can be configured to store images and/or derivatives thereof produced by the examination tool 120. Accordingly, the one or more images can be retrieved from the storage unit 122 and provided to the PMC 102 for further processing. The storage unit 122 can also be configured to store design data characterizing the specimen and/or derivatives thereof.

In some embodiments, system 101 can optionally comprise a computer-based Graphical User Interface (GUI) 124 which is configured to enable user-specified inputs related to system 101. For instance, the user can be presented with a visual representation of the specimen (for example, by a display forming part of GUI 124), including image data and/or design data of the specimen. The user may be provided, through the GUI, with options of defining certain operation parameters. The user may also view the operation results, such as, e.g., the segmentation output, on the GUI.

As aforementioned, system 101 is configured to receive, via I/O interface 126, input data including a first probability map corresponding to an image representative of at least a portion of the specimen and a first label map informative of one or more segments representative of second structural elements presented in the design data and labels associated therewith. System 101 is further configured to process at least part of the received input data and send, via I/O interface 126, the results (or part thereof) to the storage unit 122, and/or the examination tool(s) 120, and/or GUI 124 (for rendering the results) and/or external systems (e.g. Yield Management System (YMS) of a FAB).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in another embodiments at least part of examination tools 120, storage unit 122 and/or GUI 124 can be external to the examination system 100 and operate in data communication with system 101 via I/O interface 126. System 101 can be implemented as standalone computer(s) to be used in conjunction with the examination tools. Alternatively, the respective functions of the system 101 can, at least partly, be integrated with one or more examination tools 120, thereby facilitating and enhancing the functionalities of the examination tools 120 in examination related processes.

Figure 2:
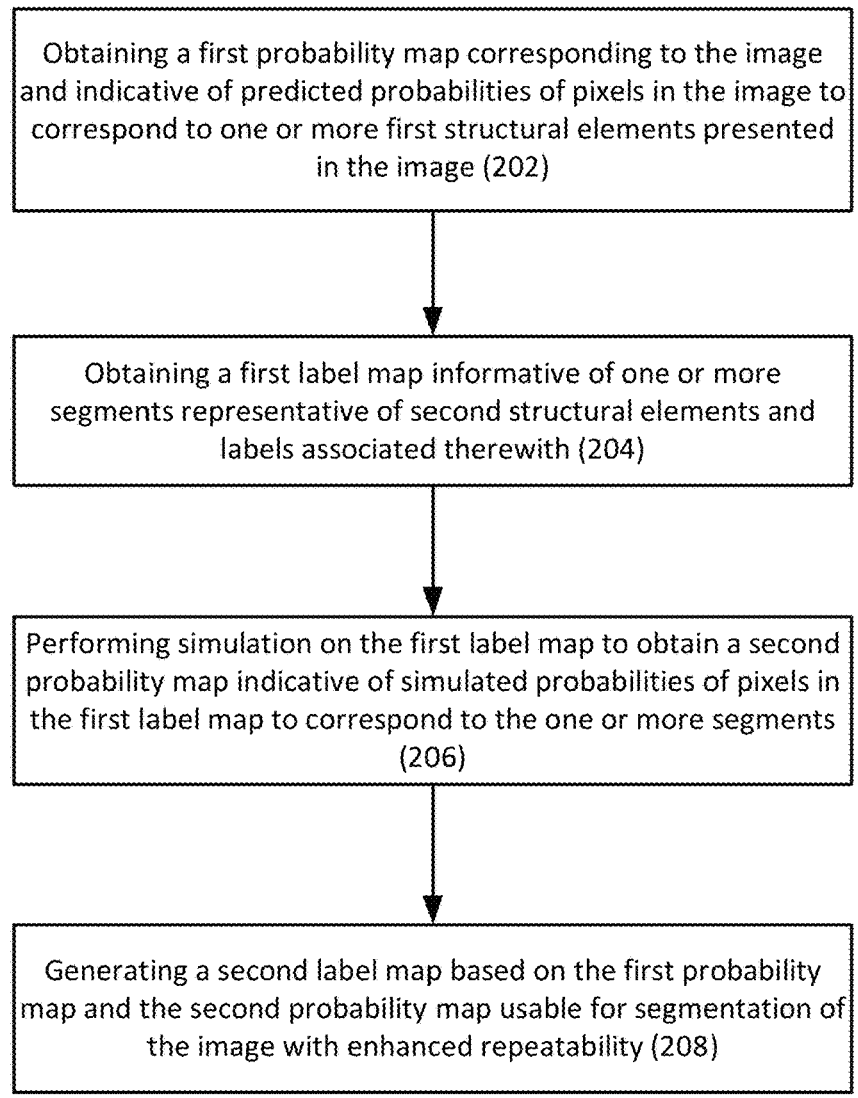
FIG. 2 illustrates a generalized flowchart of segmenting an image of a fabricated semiconductor specimen in accordance with certain embodiments of the presently disclosed subject matter.

Referring to FIG. 2, there is illustrated a generalized flowchart of segmenting an image of a fabricated semiconductor specimen in accordance with certain embodiments of the presently disclosed subject matter.

A first probability map can be obtained (202) (e.g., by the PMC 102 via the I/O interface 126). The first probability map corresponds to the image representative of at least a portion of the fabricated semiconductor specimen and indicates predicted probabilities of pixels in the image to correspond to one or more first structural elements presented in the image.

The image can be a FP image of a specimen obtained in a fabrication process thereof. By way of non-limiting example, the image can be obtained by examining a specimen using one or more inspection tools (e.g., low-resolution examination machines, such as, an optical inspection system, low-resolution SEM, etc.). Alternatively or additionally, the image can be obtained by examining the specimen using one or more review tools (e.g., high-resolution examination machines to review a subset of potential defect locations selected for review, such as a scanning electron microscope (SEM), Atomic Force Microscopy (AFM), etc.).

The first probability map can be generated by processing the image using a deep learning model (e.g., a DNN such as the segmentation network 112 as illustrated). Generally speaking, segmentation may refer to any process of partitioning an image into meaningful parts/segments (for example, background and foreground, noisy and non-noisy areas, structural elements, defect and non-defect, etc.) whilst providing per-pixel or per-region values indicative of such segments. According to certain embodiments of the presently disclosed subject matter, the segmentation network 112 can be configured to segment the image according to one or more structural elements presented in the image (also referred to herein as first structural elements, or image-based structural elements). The output of the segmentation network (i.e., the first probability map) can be a segmentation probability map in which the value of each pixel/element is indicative of a predicted probability of a corresponding pixel in the image to correspond/belong to the structural elements in the image, or, say, to belong to one or more segments representative of the structural elements in the image. In some cases, the image to be fed into the DNN can be informative of a plurality of layers of the specimen, and the first probability map can be generated for each layer.

A structural element used herein can refer to any original object on the image data or design data that has a geometrical shape or geometrical structure with a contour, or a geometrical shape combined with other object(s). A structural element that is located/presented on the image data can be referred to as an image-based structural element (also referred to herein as a first structural element). A structural element that is located/presented on the design data can be referred to as a design-based structural element (also referred to herein as a second structural element). A structural element can be presented, e.g., in the form of a polygon. A structural element can be defined by the user, or can be defined automatically, for example using rule-based or machine-learning techniques.

The first probability map is usable for generating a segmentation label map comprising per-pixel or per-region segmentation labels (also referred to herein as labels) indicative of different segments on the image. In some embodiments, each segmented structural element (and/or pixels thereof) can be assigned with a segmentation label, and equivalent structural elements on the image can be associated with the same label. Equivalent structural elements can refer to structural elements that correspond to the same design pattern, irrespective of the orientation thereof. By way of example, the structural elements (e.g., the polygons) on one layer can have one segmentation label, and the polygons on another layer can have a different segmentation label, while the background can have a separate segmentation label.

Figure 3:
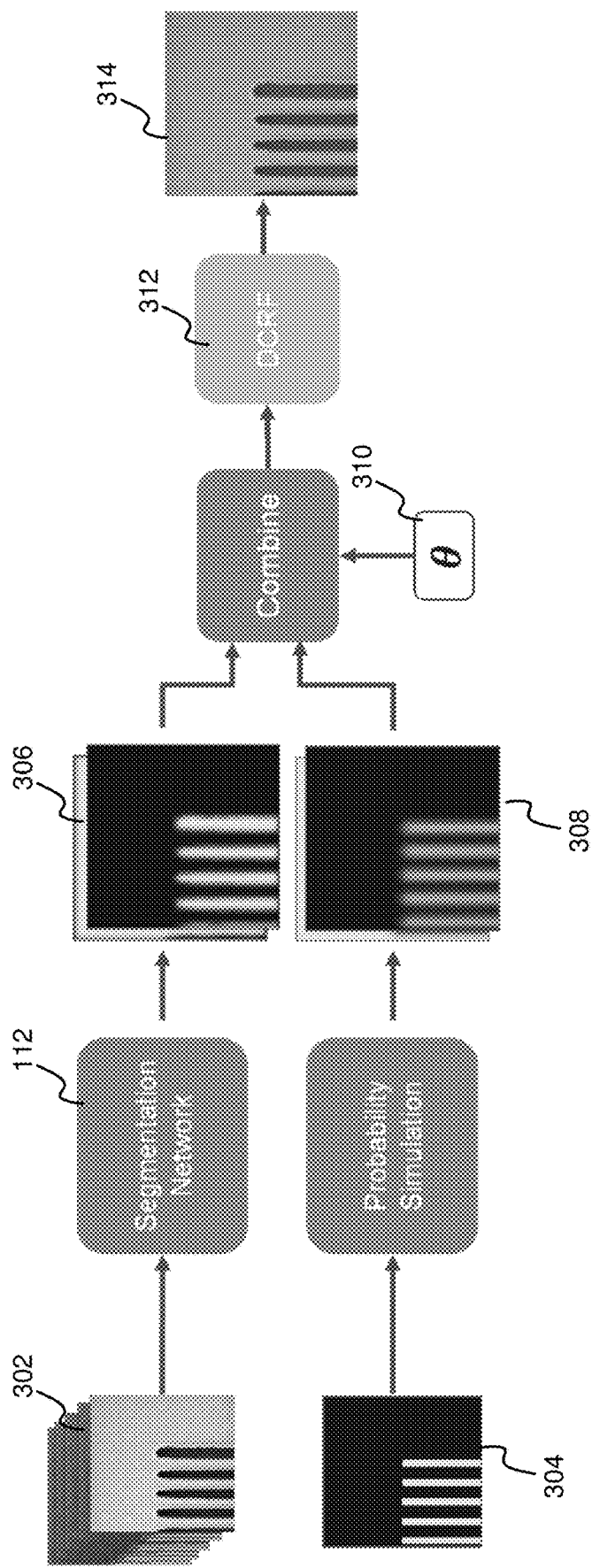
FIG. 3 exemplifies a schematic diagram of segmenting an image of a specimen in accordance with certain embodiments of the presently disclosed subject matter.

For purpose of illustration, reference is also made to FIG. 3, exemplifying a schematic diagram of segmenting an image of a specimen in accordance with certain embodiments of the presently disclosed subject matter. As shown, an image 302 of a specimen captured by an examination tool 120 is received and fed into a segmentation network 112 for processing, giving rise to a first probability map 306, as described above. It is to be noted that in some cases, the image 302 can be informative of multiple layers of the specimen, where each layer contains different types of structural elements. In such cases, multiple first probability maps 306 can be generated corresponding to respective layers of the specimen.

According to certain embodiments of the presently disclosed subject matter, a segmentation probability map generated using a segmentation network by processing an image of a specimen can result in relatively sensitive segmentation output. By way of example, the segmentation network can be designed with a specific architecture and/or trained in specific ways for the purpose of enhancing segmentation sensitivity. In such cases, the segmentation probability map, and/or the segmentation label map derived therefrom, can result in high sensitivity. By way of example, the segmentation output may tightly follow certain image characteristics which may be affected by physical processes, such as imaging conditions, tool/process variations etc. For instance, the segments as indicated in the segmentation label map can have high accuracy and consistency with respect to the structural elements presented in the image (e.g., the contours of the segments closely match the polygons in the image, thus the edges can be rough/blurry, and certain pixels/areas within a polygon can be assigned with segmentation labels that are inconsistent with the neighboring pixels, etc.). In such cases, different images captured for the same location of the same specimen may result in different segmentation outcomes due to the variances presented in the images. Such segmentation outcomes are less desired since customers require repeatable segmentation (also termed precise segmentation) for the same specimen, irrespective of variances caused in different images. According to certain embodiments of the presently disclosed subject matter, there is proposed a method and system of using design-based data (i.e., generating a simulated probability map using a design label map) to influence the image segmentation, thereby improving repeatability/precision of the segmentation, as described in further detail below.

In addition to the first probability map, a first label map can also be obtained (204) (e.g., by the PMC 102 via the I/O interface 126). The first label map can be a segmentation label map informative of one or more segments representative of second structural elements and labels associated with the segments. The second structural elements, as mentioned above, are design-based structural elements presented in design data charactering the at least portion of the specimen. Similarly, equivalent second structural elements are associated with the same label. In other words, the first label map can be referred to as a design label map since the segments thereof correspond to the design-based structural elements. An example of the first label map is illustrated in FIG. 3 as 304. As shown in the present example, the first label map 304 presents two segments (differentiated by different gray levels): one segment corresponds to the structural elements (e.g., the columns as illustrated) comprised therein, and the other segment corresponds to the background.

It is noted that although the first label map is informative of segments corresponding to design-based structural elements, it does not necessarily have to be generated based on design data. According to certain embodiments, the first label map can be generated based on at least one of the following: the design data, the image, and the first probability map. By way of example, the first label map can be generated based on design data, e.g., by performing simulation on the design data such that the design-based structural elements thereof are associated with respective segmentation labels. In some cases, such simulation also takes into consideration the difference between the design-based structural elements and the corresponding image-based structural elements. For instance, in some cases, due to the conditions of the design tool and/or the imaging tool, a design-based structural element such as a polygon may actually appear in the shape of a circle in the image. The simulation can take it into consideration and generate a simulated label map including the structural element with a simulated shape as it would have appeared in the image.

By way of another example, the first label map can be generated based on the image. For instance, the label map can be created manually in accordance with the appearance of the structural elements in a SEM image. By way of a further example, the first label map can be generated based on the first probability map. For instance, the first label map can be generated by identifying repetitive structural elements/patterns in the first probability map, averaging the repetitive patterns to obtain a common pattern having a smoother shape without variation, and placing the common pattern in the positions of the respective repetitive patterns.

In some cases, the first label map can be pre-generated in accordance with the various generation methods described above and stored in the storage unit 122 or the design data server 110 to be provided to the PMC 102 for further processing. Alternatively, in some other cases, the generation process can be performed by the PMC 102 (i.e., the functionality of the label map generation can be integrated into PMC 102) as a pre-processing step.

Upon obtaining the first label map, simulation can be performed (206) (e.g., by the simulation module 104) on the first label map to obtain a second probability map indicative of simulated probabilities of pixels in the first label map to correspond to the one or more segments. The second probability map is also referred to herein as a simulated probability map. As illustrated in FIG. 3, the probability simulation is performed on the first label map 304, giving rise to a simulated probability map 308.

According to certain embodiments, the simulation from the first label map to the second probability map can include a distance transform and probability transform. Specifically, a distance transform can be performed on the first label map to obtain a distance map. The distance transform can be based on a relative distance between each given pixel in the first label map and a closest edge therefrom. The distance map can then be transformed into the second probability map informative of simulated probabilities of the pixels in the first label map to correspond to the one or more segments as relative to the closest edge.

Figure 4:
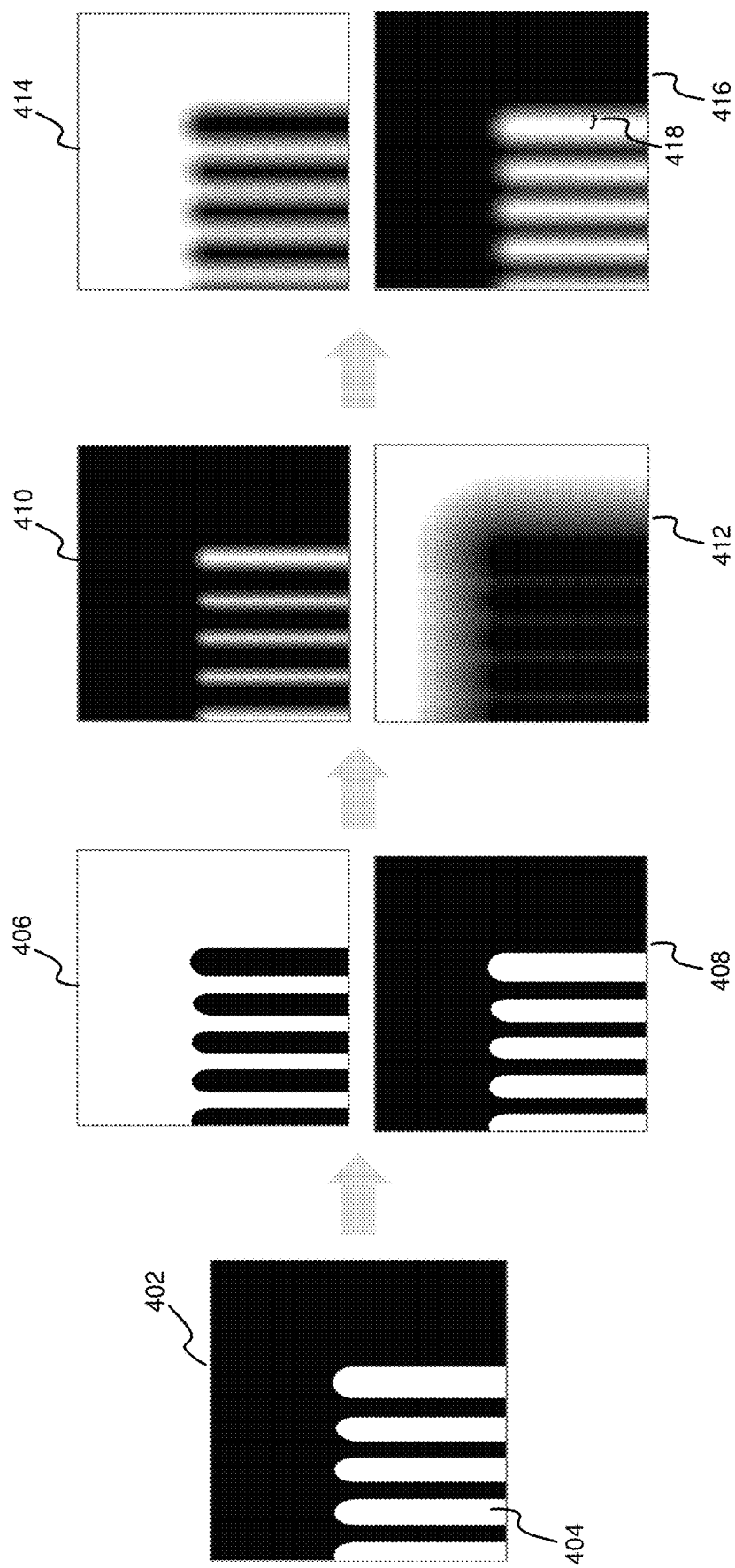
FIG. 4 illustrates an example of a simulation process from the first label map to the second probability map in accordance with certain embodiments of the presently disclosed subject matter.

Turning now to FIG. 4, there is illustrated an example of a simulation process from the first label map to the second probability map in accordance with certain embodiments of the presently disclosed subject matter.

As shown, a first label map 402 is generated in accordance with the generation methods as described above, to represent segments corresponding to design-based structural elements 404. While not necessarily so, the first label map 402 can be separated into one or more layers according to the design (e.g., two layers in the present example, the background layer 406 and the foreground layer 408, i.e., the layer with the structural elements 404). A distance transform is performed respectively on the two layers 406 and 408, giving rise to two corresponding distance maps 410 and 412. For better illustration of the distance transform, attention is now directed to FIG. 5.

Figure 5:
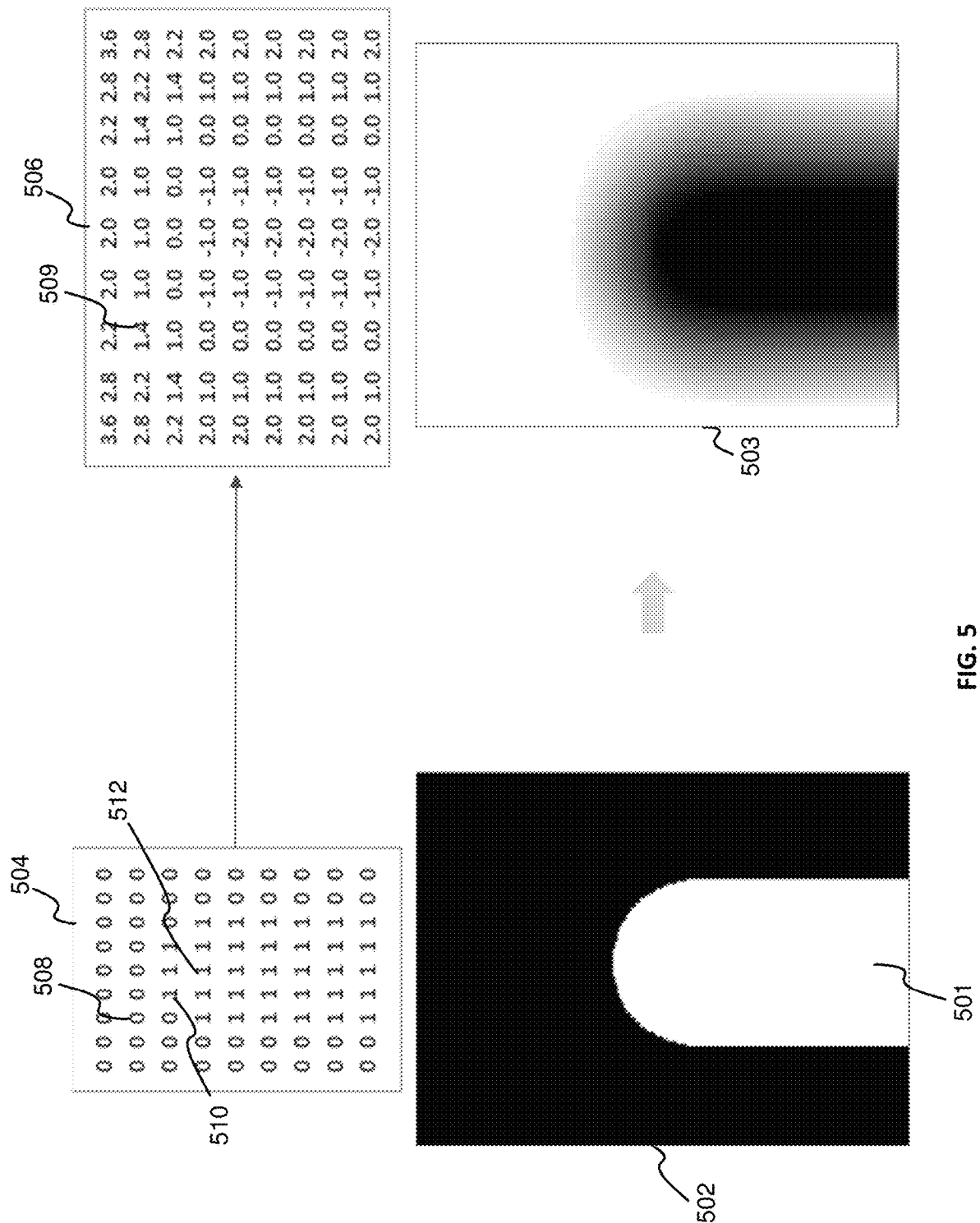
FIG. 5 illustrates an example of a distance transform from a first label map to a corresponding distance map in accordance with certain embodiments of the presently disclosed subject matter.

Referring now to FIG. 5, there is illustrated an example of a distance transform from a first label map to a corresponding distance map in accordance with certain embodiments of the presently disclosed subject matter.

As shown, a first label map 502 (or one layer separated therefrom) can be presented in the form of a binary map 504, in which the value of "1" represents a label of a segment corresponding to a structural element 501, and the value of "0" represents a label of the background. Therefore, in the binary map, the pixels of "1" (such as, e.g., pixel 510) next to the pixels of "0" can indicate an edge of the structural element. The distance transform can be performed on the binary map 504 to obtain a distance map 506 based on a relative distance between each given pixel in the binary map 504 and a closest edge therefrom. By way of example, the relative distance includes, for each given pixel in the first label map: i) a distance between the given pixel and a closest edge therefrom, and ii) a relative position of the given pixel with respect to the closet edge. The relative position can indicate whether the given pixel is located within a given second structural element whose contour comprises the closest edge (i.e., within the contour), or outside of the given second structural element (i.e., outside the contour). For instance, for a given pixel 508, the closest edge is indicated by the diagonal pixel 510 whose value is "1". Thus the distance between the pixels 508 and 510 can be calculated (e.g., 1.4 in the present example). Considering the pixel 508 is outside of the structural element 501, a positive value of 1.4 can be assigned in the corresponding position 509 in the distance map 506. Otherwise, in the case of a given pixel being located within a given structural element, such as, e.g., pixel 512, a negative value can be assigned in the distance map to indicate this relative position. Similarly, such distance transform can be performed for all the pixels in the binary map 504, and a corresponding distance map 506 (and corresponding representative image 503) can be generated. It is to be noted that the specific numbers, positive and negative values, as well as the calculation methods of the distances, are for purpose of exemplification and illustration only, and should not be construed to limit the present disclosure in any way.

As can be seen from the example of FIG. 5, the distance map generated from the distance transform is informative of a relative distance between each pixel and a nearby edge thereof (e.g., in terms of the distance therebetween and a relative location with respect to the nearby edge). Referring back to FIG. 4, a probability transform is then performed respectively on the two distance maps 410 and 412 generated as described with reference to FIG. 5, giving rise to two probability maps 414 and 416. By way of example, the probability transform can include normalizing the values in the distance maps to the range of [0, 1]. For instance, one way of normalization is to calculate a corresponding probability value (denoted as p) as an exponential function of the relative distance (denoted as d), such as, e.g., $p=e^{-d}$, or $p=e^{-d^2}$ (also referred to herein as normalization function).

In a probability map generated in such a way, such as, e.g., the probability map 416, the pixels located in the central region of a structural element typically have high probability values such as 1 or close to 1. As moving from the center towards the edge of the structural element, the probability values of the pixels gradually decrease. When reaching a certain point outside of the edge, the probability value eventually reduces to 0. The probability map 416 shows such a gradual change of the probability values (illustrated as a ramp 418 of pixel values changing from 1 to 0). It is to be noted that the above exemplified normalization functions are listed for purpose of illustration only and should not be regarded as limiting the present disclosure in any way. Any other suitable functions can be used in lieu of the above. In some cases, the exponential function used in the normalization can possibly combine one or more additional parameters which may indicate certain characteristics of the distance map and can be used for tuning the probability normalization. One example of such an additional parameter can be a parameter indicative of, e.g., the smoothness of the distance map, and can be used to tune the steepness of the transition from 1 to 0 in the probability map. Optionally, the probability maps 414 and 416 corresponding to the two layers can be summed/combined into one probability map for further processing, e.g., by applying an argmax function on the two probability maps.

Continuing with the description of block 206 of FIG. 2, the second probability map generated in accordance with the above description of FIG. 5 can be indicative of simulated probabilities of pixels in the first label map to correspond to the one or more segments represented in the first label map. The probability simulation takes into consideration possible effects caused by a physical process, such as, e.g., process variation. The simulated probabilities reflect the likelihood of the pixels in the first label map to belong to the "real life" segments (i.e., how these segments would actually appear after e.g., process variation) which correspond to the segments represented in the first label map. By way of example, the simulated probability map indicates an underlying principle that the pixels in the center of a structural element would theoretically have higher probability of belonging to a segment corresponding to the structural element as compared to the pixels surrounding the contours of the structural element (e.g., pixels that are further away from the center and pixels that are located outside of contour of the structural element).

A second label map can be generated (208) (e.g., by the label map generation module 106) based on the first probability map and the second probability map. The second label map is informative of one or more segments representative of the first structural elements (i.e., image-based structural elements) and labels associated therewith. Equivalent first structural elements are associated with the same label. The second label map is an improved segmentation label map as compared to a segmentation label map generated from only the first probability map, and can be usable for segmentation of the image with enhanced repeatability/precision.

According to certain embodiments, generation of the second label map can comprise: combining the first probability map and the second probability map to obtain a combined probability map, and using a solver to process the combined probability map to give rise to a second label map. A solver generally refers to an algorithm that takes a problem description in a generic form and calculates a solution for the problem. In the present subject matter, the solver refers to an algorithm that, based on the input information of the probability maps (in some cases also the image), decides where to place the border of separation of the segments. In some cases, the combining of the first probability map and the second probability map can be performed using a predetermined weight factor indicative of a desired tradeoff level between sensitivity and repeatability of the segmentation of the image. By way of example, in some cases, such a weight factor can be determined, e.g., by the customer, according to certain specification requirements. In some cases, such a weight factor can be selected from a group of candidate factors. By applying a weighted combination using the weight factor, the amount of design-based data influence on the image-based data can be controlled and a desired balance between sensitivity and repeatability of the segmentation can be achieved.

According to certain embodiments, the solver can be selected from a group comprising: dense conditional random field (DCRF), Graph-cut and Hidden Markov Model (HMM). In one embodiment, the solver can be a DCRF solver. The DCRF solver can accept a single data term in the shape of probabilities (e.g., the combined probability map) and generate a label map determining which label to assign to each pixel. In some other embodiments, in addition to the combined probability map, the DCRF can accept the image as an additional input, and generate a label map based on both inputs.

In some embodiments of the present disclosure, the DCRF can be used to process the combined probability map based on a unary term and a pairwise term. The DCRF applies an iterative algorithm that converges to a local minimum after N iterations (N can be predefined). A local minimum means that a segmentation label map is generated in which the given labels minimize an error function $E(x)$ related to the unary term and the pairwise term.

By way of example, the unary term can be based on the probability of the pixel to be related to a specific segment. For instance, the unary term can be a function of argmax( ), which outputs the segment with the highest probability for this pixel. The pairwise term can be constructed from two adversary terms. For instance, the pairwise term can be constructed based on an appearance kernel and a smoothness kernel. The appearance kernel can be an edge preserving denoiser (also termed as a bilateral filter) that determines a label of a given pixel based on similar neighboring pixels thereof (i.e., it determines the label of the pixel by looking at its nearby neighbors that look alike (e.g., share a similar probability)). The outcome is that the appearance kernel smoothens the probability map but preserves sharp edges between segments. By way of example, the appearance kernel can be implemented as an exponential function related to the relative locations and the similarities between neighboring pixels. The smoothness kernel determines a label of a given pixel based on neighboring pixels thereof. It smoothens the probability map without preserving edges. By way of example, the smoothness kernel can be implemented as an exponential function related to the relative locations between pixels.

By applying both kernels, the combined probability map can be smoothened from at least the following two aspects: i) the probabilities within the contour of each structural element can be smoothened, which is based on the assumption that pixels within a polygon should normally belong to the same segment; and ii) the probabilities along the contour of each structural element can be smoothened while preserving the edges, which is based on the assumption that polygons normally have smooth but not rough contours.

It is to be noted that DCRF is described herein as one example of a model usable for processing the combined probability map to obtain a smoothened segmentation label map, and should not be regarded as limiting the present disclosure in any way. Other suitable models and/or tools and/or methods usable for image smoothing and image segmentation, such as, e.g., Graph-cut and Hidden Markov Model (HMM), can be used in addition to, or in lieu of, the above.

Among advantages of certain embodiments of the segmentation process as described herein is using design-based data derived in a specific way (e.g., simulated probability map derived from a design label map) to influence segmentation of an image of a fabricated semiconductor specimen, thereby improving repeatability and precision of the segmentation outcome. The influence can be achieved by combining the simulated probability map with the probability map obtained from processing the image, and deriving an enhanced segmentation label map by processing the combined probability map. The enhanced segmentation can be used for different applications, such as, e.g., ADC, ADR, defect detection, matching, metrology and other examination tasks.

As illustrated in FIG. 3, the two probability maps 306 and 308 are combined using a weight factor θ (illustrated as 310), and the combined probability map is provided as input to DCRF 312 to be processed. As a result, a second label map 314 with enhanced repeatability is derived. The second label map 314 has enhanced repeatability as compared to a label map generated from only the first probability map 306.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

What is claimed is:

1. A computerized method of segmenting an image of a fabricated semiconductor specimen, the method performed by a processor and memory circuitry (PMC), the method comprising:
    obtaining a first probability map corresponding to the image representative of at least a portion of the fabricated semiconductor specimen and indicative of predicted probabilities of pixels in the image to correspond to one or more first structural elements presented in the image, wherein the first probability map is generated by processing the image using a deep learning model;
    obtaining a first label map informative of one or more segments representative of second structural elements and labels associated with the one or more segments, wherein the second structural elements are presented in design data characering the at least a portion, and wherein equivalent second structural elements are associated with a same label;
    performing simulation on the first label map to obtain a second probability map indicative of simulated probabilities of pixels in the first label map to correspond to the one or more segments; and
    generating a second label map based on the first probability map and the second probability map, wherein the second label map is informative of one or more segments representative of the first structural elements and labels associated therewith, and wherein equivalent first structural elements are associated with a same label, the second label map being usable for segmentation of the image with enhanced repeatability.

2. The computerized method according to claim 1, wherein the performing of the simulation comprises:
    performing a distance transform on the first label map to obtain a distance map based on a relative distance between each given pixel in the first label map and a closest edge therefrom; and
    transforming the distance map into the second probability map informative of simulated probabilities of the pixels in the first label map to correspond to the one or more segments as relative to the closest edge.

3. The computerized method according to claim 2, wherein the relative distance includes, for each given pixel in the first label map: i) a distance between the given pixel and a closest edge therefrom, and ii) a relative position of the given pixel with respect to the closest edge.

4. The computerized method according to claim 3, wherein the relative position indicates whether the given pixel is located within a given second structural element whose contour comprises the closest edge, or outside of the given second structural element.

5. The computerized method according to claim 1, wherein the first label map is generated based on at least one of the following: the design data, the image, and the first probability map.

6. The computerized method according to claim 1, wherein the generating comprises: combining the first probability map and the second probability map to obtain a combined probability map; and using a resolver to process the combined probability map, giving rise to the second label map.

7. The computerized method according to claim 6, wherein the combining is performed using a predetermined weight factor indicative of a desired tradeoff level between sensitivity and repeatability of the segmentation of the image.

8. The computerized method according to claim 6, wherein the resolver is selected from a group comprising: dense conditional random field (DCRF), Graph-cut and Hidden Markov Model (HMM).

9. The computerized method according to claim 6, wherein the resolver is a DCRF resolver, and wherein the combined probability map is processed based on a unary term and a pairwise term.

10. The computerized method according to claim 9, wherein the pairwise term is constructed based on an appearance kernel and a smoothness kernel.

11. The computerized method according to claim 10, wherein the appearance kernel is an edge preserving denoiser that determines a label of a given pixel based on similar neighboring pixels thereof, and the smoothness kernel determines a label of a given pixel based on neighboring pixels thereof.

12. The computerized method according to claim 1, wherein the image is a high-resolution review image of the specimen obtained from a review tool.

13. The computerized method according to claim 1, wherein the second label map has enhanced repeatability as compared to a label map generated from the first probability map.

14. A computerized system of segmenting an image of a fabricated semiconductor specimen, the system comprising a processor and memory circuitry (PMC) configured to:
  obtain a first probability map corresponding to the image representative of at least a portion of the fabricated semiconductor specimen and indicative of predicted probabilities of pixels in the image to correspond to one or more first structural elements presented in the image, wherein the first probability map is generated by processing the image using a deep learning model;
  obtain a first label map informative of one or more segments representative of second structural elements and labels associated with the one or more segments, wherein the second structural elements are presented in design data characering the at least a portion, and wherein equivalent second structural elements are associated with a same label;
  perform simulation on the first label map to obtain a second probability map indicative of simulated probabilities of pixels in the first label map to correspond to the one or more segments; and
  generate a second label map based on the first probability map and the second probability map, wherein the second label map is informative of one or more segments representative of the first structural elements and labels associated therewith, and wherein equivalent first structural elements are associated with a same label, the second label map being usable for segmentation of the image with enhanced repeatability.

15. The computerized system according to claim 14, wherein the PMC is configured to perform the simulation by:
  performing a distance transform on the first label map to obtain a distance map based on a relative distance between each given pixel in the first label map and a closest edge therefrom; and
  transforming the distance map into the second probability map informative of simulated probabilities of the pixels in the first label map to correspond to the one or more segments as relative to the closest edge.

16. The computerized system according to claim 15, wherein the relative distance includes, for each given pixel in the first label map: i) a distance between the given pixel and a closest edge therefrom, and ii) a relative position of the given pixel with respect to the closest edge.

17. The computerized system according to claim 16, wherein the relative position indicates whether the given pixel is located within a given second structural element whose contour comprises the closest edge, or outside of the given second structural element.

18. The computerized system according to claim 14, wherein the PMC is configured to generate a second label map by: combining the first probability map and the second probability map to obtain a combined probability map; and using a resolver to process the combined probability map, giving rise to the second label map.

19. The computerized system according to claim 18, wherein the combining is performed using a predetermined weight factor indicative of a desired tradeoff level between sensitivity and repeatability of the segmentation of the image.

20. A non-transitory computer readable storage medium tangibly embodying a program of instructions that, when executed by a computer, cause the computer to perform a method of segmenting an image of a fabricated semiconductor specimen, the method comprising:
  obtaining a first probability map corresponding to the image representative of at least a portion of the fabricated semiconductor specimen and indicative of predicted probabilities of pixels in the image to correspond to one or more first structural elements presented in the image, wherein the first probability map is generated by processing the image using a deep learning model;
  obtaining a first label map informative of one or more segments representative of second structural elements and labels associated with the one or more segments, wherein the second structural elements are presented in design data characterizing the at least portion, and wherein equivalent second structural elements are associated with a same label;
  performing simulation on the first label map to obtain a second probability map indicative of simulated probabilities of pixels in the first label map to correspond to the one or more segments; and
  generating a second label map based on the first probability map and the second probability map, wherein the second label map is informative of one or more segments representative of the first structural elements and labels associated therewith, and wherein equivalent first structural elements are associated with a same label, the second label map being usable for segmentation of the image with enhanced repeatability.

* * * * *